US006512383B1

(12) United States Patent
Gömöry et al.

(10) Patent No.: US 6,512,383 B1
(45) Date of Patent: Jan. 28, 2003

(54) SYSTEM FOR MEASURING THE ALTERNATING CURRENT EQUIVALENT SERIES RESISTANCE OF A CONDUCTOR

(75) Inventors: Fedor Gömöry, Bratislava (SK); Laura Gherardi, Monza (IT); Giacomo Coletta, Peschiera Borromeo (IT)

(73) Assignee: Pirelli Cavi e Sistemi S.p.A., Milan (IT)

( * ) Notice: Subject to any disclaimer, the term of this patent is extended or adjusted under 35 U.S.C. 154(b) by 0 days.

(21) Appl. No.: 09/488,832

(22) Filed: Jan. 21, 2000

Related U.S. Application Data

(63) Continuation of application No. PCT/EP98/03719, filed on Jun. 28, 1998.
(60) Provisional application No. 60/053,810, filed on Jul. 25, 1997.

(30) Foreign Application Priority Data

Jul. 23, 1997 (IT) .......................................... MI97A1740

(51) Int. Cl.$^7$ ........................ G01R 27/08; G01R 31/302
(52) U.S. Cl. ........................ 324/713; 324/714; 324/704; 324/705; 324/720; 324/543; 324/650
(58) Field of Search ................................. 324/600, 704, 324/705, 713, 714, 720, 543, 650, 649

(56) References Cited

U.S. PATENT DOCUMENTS 4,175,253 A * 11/1979 Pitegoff ........................ 324/704
4,335,349 A * 6/1982 Baldock et al. ............. 324/601
4,584,525 A * 4/1986 Harnden, Jr. et al. ....... 324/126

(List continued on next page.)

FOREIGN PATENT DOCUMENTS

DE  10 67 924   10/1959
DE  10 73 621   1/1960

OTHER PUBLICATIONS

F. Castelli et al., "A New Method for Measuring the A.C. Resistance of Large Cable Conductors", IEEE Trans. on Power and Apparatus & Systems, vol. PAS–96, No. 2, pp. 414–421, (1977).
A.H.M. Arnold, "Eddy–Current Losses in Single–Conductor Paper–Insulated Lead–Covered Unarmoured Cables of a Single–Phase System", Transmission Section Paper, Part. II, J. IEE, vol. 89, pp. 636–645, (1942).
A.H.M. Arnold, "Proximity Effect in Solid and Hollow Round Conductors", Transmission Section Paper, Part. II, J. IEE, vol. 88, pp. 349–359, (1941).
F. Castelli et al., "A New Method for Measuring the A.C. Resistance of Large Cable Conductors", IEEE Transactions on Power Apparatus and Systems, vol. PAS–96, No. 2, pp. 414–422, (1977).

*Primary Examiner*—N. Le
*Assistant Examiner*—Wasseem H. Hamdan
(74) *Attorney, Agent, or Firm*—Finnegan, Henderson, Farabow, Garrett & Dunner, L.L.P.

(57) ABSTRACT

A system and method for measuring the alternating current series resistance of a conductor when transporting large currents on the order of several thousand amperes. The system comprises a current sensor, a current/voltage converter, a voltage divider, a voltage sensor, a null indicator, and a voltage meter. The alternating current series resistance is measured by measuring a real component of a voltage drop over a predetermined length of the conductor, deriving a measurement current from the conductor, converting the measurement current into a measurement voltage, withdrawing an adjustable portion of voltage from the measurement voltage, comparing the adjustable portion of voltage with the voltage drop, adjusting the adjustable portion of voltage to balance the voltage drop, measuring the alternating current, and determining the resistance of the conductor as a function of the value of the adjustable portion of voltage that balances the voltage drop and the measured alternating current.

22 Claims, 2 Drawing Sheets

U.S. PATENT DOCUMENTS

| | | | |
|---|---|---|---|
| 4,645,906 A | * | 2/1987 | Yagnik et al. ............... 392/469 |
| 4,683,419 A | * | 7/1987 | Neuelmann et al. ........ 324/718 |
| 4,743,846 A | * | 5/1988 | Leclerc et al. .............. 324/126 |
| 4,797,604 A | * | 1/1989 | Rocci et al. ................. 324/699 |
| 4,808,914 A | * | 2/1989 | Talmor ....................... 324/705 |
| 5,210,490 A | * | 5/1993 | Munch et al. ............ 324/207.1 |
| 5,227,720 A | * | 7/1993 | Gross et al. ................ 324/235 |
| 5,365,179 A | * | 11/1994 | Rogers ....................... 324/650 |
| 5,469,070 A | * | 11/1995 | Koluvek ...................... 324/713 |
| 5,481,200 A | * | 1/1996 | Voegele et al. ............. 324/718 |
| 5,532,590 A | * | 7/1996 | Yamanaka .................. 324/239 |
| 5,557,197 A | * | 9/1996 | Schulze et al. ............. 324/115 |
| 5,691,644 A | * | 11/1997 | Danilyak .................... 324/543 |
| 5,804,979 A | * | 9/1998 | Lund et al. ................. 324/713 |
| 5,818,243 A | * | 10/1998 | Wakamatsu ................. 324/649 |
| 6,112,531 A | * | 9/2000 | Yamaguchi ................. 62/51.1 |

* cited by examiner

SYSTEM FOR MEASURING THE ALTERNATING CURRENT EQUIVALENT SERIES RESISTANCE OF A CONDUCTOR

This application is a continuation of International Application No. PCT/EP98/03719, filed Jun. 18, 1998, the content of which is incorporated herein by reference and claims the benefit of U.S. Provisional Application No. 60/053,810 filed Jul. 25, 1997.

BACKGROUND OF THE INVENTION

The present invention relates to a system and a method for measuring the alternating current equivalent series resistance of a conductor, in particular when transporting a large current, i.e. of the order of a few thousand Amperes (around 3000 A).

When carrying an alternating electric current, at a frequency of 50 Hz for example, a conductor will exhibit an impedance having a real or active component and an imaginary or reactive component. Measurement of the alternating-current resistance refers to the value, per unit length ($\Omega$/m), of the real component of the impedance of the conductor.

Today, as a result of the rapid increase in the power required by electrical systems, cables are made for high voltage with conductors of greater than 1000 mm$^2$ cross-section. In order to be able to assess the performance of a cable of this kind and quantify the magnitude of the power losses it is important to know the value of the alternating current equivalent, series resistance of a conductor.

With conductors of such dimensions the nonuniform distribution of current within the cross-section causes a considerable rise in the alternating current equivalent series resistance. As is known, this phenomenon is due principally to two effects referred to as the skin effect and the proximity effect.

The skin effect corresponds to the tendency of the alternating current to flow close to the surface of a conductor, thereby reducing the useful cross-section for passage of the current and increasing the resistance thereof.

The proximity effect entails a redistribution of the current in the conductor, due to the closeness of another conductor.

Considering the difficulty of applying traditional methods of calculating resistance, such as those discussed in the articles listed below and from the CEI (Commission Electronique International) 287 standard, to the conductors used in practice, made up of a very large number of wires more or less insulated from one another, the only means of assessing the alternating current equivalent series resistance is through experimental methods.

The articles relating to the methods of calculation are: "Eddy current losses in single-conductor paper insulated lead covered unarmoured cables of single-phase system", A. H. Arnold, Vol. 89, Part II, J. IEE, p. 636, 1942; and "Proximity effect in solid and hollow round conductors", A. H. Arnold, Vol. 88, Part. II, J. IEE, p. 349–359, 1941.

Measurement of the alternating-current resistance is of considerable interest both in the course of research, where it is used to improve the design of the conductor, and in industry, for testing the finished product.

In particular, the method used must guarantee the typical repeatability and accuracy of the methods employed in the course of research, but must be sufficiently simple to be industrially applicable.

Measurement of the alternating-current resistance must take into account the temperature of the cable, the frequency of the flowing current, and the closeness of other conductors.

The alternating-current resistance of cables of 1000 mm$^2$ cross-section is of the order of $10^{-4}$–$10^{-5}$ $\Omega$/m and the accuracy of the measurement should be at least 0.1%.

One technique for measuring the alternating-current resistance makes use of networks of the bridge type on account of their simplicity and the absence of initial calibrations.

A bridge network consists of a quadrilateral of impedances, one of which is unknown. A null indicator (normally consisting of a galvanometer) is inserted into one of the diagonals, and the power supply into the other. By modifying the value of one or more arms, of known value, so as to zero the null indicator, the value of the unknown impedance is derived from the value of the other impedances. The accuracy of a bridge system depends directly on the accuracy of the known impedances.

For example, an accuracy of measurement of around 0.2% is achievable with impedances having an accuracy of 0.1%. Better accuracies can be obtained only with special preliminary calibrations.

Furthermore, if harmonic contributions at frequencies higher than the working frequency are present in the current flowing in the conductor, as normally happens, measurement with the bridge could overestimate the value of the resistance. The article by F. Castelli, L. Maciotta-Rolandin, P. Riner entitled "A new method for measuring the AC resistance of large cable conductors", published in March–April 1977 in IEEE Transactions on Power Apparatus and Systems, vol. PAS-96, No. 2 pp. 414–422, describes a bridge for measuring alternating-current resistance, based on the so-called Maxwell bridge which uses a transformer in one arm in such a way that the measurement bridge is not traversed by the high current of the conductor.

The measurement of the alternating-current resistance can be derived from the ratio between the real component of the voltage withdrawn over a predetermined length of the conductor and the current flowing in this conductor. With the current flowing in the conductor known, the measurement of the voltage can be effected with an instrument capable of discriminating and measuring the real component from the imaginary one. An instrument of this type is the so-called lock-in amplifier, such as for example that sold by Stanford Research Systems, 1290-D Reamwood Ave., Sunnyvale, Calif., model SR-830.

This amplifier has a measurement accuracy (or gain accuracy) equal to 1%, deemed insufficient for measuring alternating-current resistance.

German patent DE-1,067,924 discloses a network test device for determining the short circuit current intensity in a network of electrical conductors. In that device a load resistor is syncronously connected and disconnected with a frequency depending on the network frequency. The load resistor temporarily lowers the network voltage. An indicator shows the voltage difference between the connected and the disconnected status. The voltage of the periodically loaded network is sent to two channels. A first channel comprises a variable delay line, a second channel comprises a variable attenuator. The average of the sum (or difference) voltage between the two channels is measured by a rectifier instrument. The two channels are then equalized so that the instrument gives a zero reading in case of unloaded network. The frequency of connection and disconnection of the load resistor can be different from the network frequency, e.g., one half or one third or even double the network frequency.

German patent DE-1,073,621 disclose a method for measuring the internal network resistance (impedance and phase angle) at the network frequency. The method employs a measuring voltage at a frequency higher (harmonic) than the network frequency and a dummy load that is switched to the network terminals with the network frequency. The load current is flown in a compensation device comprising a variometer with a switchable conversion ratio and an ohmic resistance, from which a sum voltage is derived. The sum voltage has a component in phase with the load current and a component advancing in phase by 900 the load current and is adjustable in intensity by the variometer. The sum voltage is switched against a voltage derived from the network voltage. The signal resulting from two voltages is bandpass filtered at the frequency of the measuring voltage and read in an instrument. The variometer and a potentiometer are adjusted until a null reading is achieved on the instrument. The phase angle measurement is then carried out by reading the variometer setting. The instrument is then switched to measure the sum voltage, while at the same time the variometer conversion ratio is switched to a second value. A measurement of the internal impedance of the network is so derived.

The Applicant has found that the measurement accuracy can be greatly increased, beyond the accuracy limit of the available instrument, by measuring with the latter not the value of the quantity to be measured, but rather the difference between the said quantity and a known and adjustable quantity. In this way the measurement error of the instrument, proportional to the value of the actual measurement, can be reduced by making the said difference tend to zero, or in any event by taking the said difference to a value such that the relative error of measurement is less than a predefined value.

SUMMARY OF THE INVENTION

In a first aspect the present invention relates to a method for measuring the series resistance of a conductor traversed by an alternating current comprising the phases of:

measuring at least a real component of a voltage drop over a predetermined length of the said conductor;

deriving a measurement current from the said conductor, the said measurement current having a real component only and having a predetermined relationship with the said alternating current; characterized by converting the said measurement current into a corresponding measurement voltage having a predefined conversion ratio with the said measurement current;

withdrawing an adjustable portion of voltage from the said measurement voltage;

comparing the said adjustable portion of voltage with the said voltage drop;

adjusting the said adjustable portion of voltage in such a way as to balance the said voltage drop;

measuring the said adjustable portion of voltage which balances the said voltage drop;

measuring the said alternating current; determining the resistance as a function of the value of the said adjustable portion of voltage which balances the said voltage drop and of the value of the said alternating current.

For the purposes of the present invention, in order to balance the voltage drop it is intended to generate a corresponding voltage of a value such that the difference between the said generated voltage and the said voltage drop is substantially close to zero (to within a value correlated with the desired degree of accuracy of measurement).

Preferably, the phase of measuring the said alternating current comprises the phases of:

measuring the said measurement voltage;

determining the value of the said alternating current as a function of the said measured measurement voltage, of the said predefined conversion ratio and of the said predetermined relationship.

Preferably, it further comprises the phase of eliminating the imaginary component of the said voltage drop.

In particular, the phase of eliminating the imaginary component of the said voltage drop comprises the phases of:

measuring an imaginary component of the said voltage drop;

withdrawing a further adjustable voltage from the said conductor, having an imaginary component only;

comparing the said further voltage with the imaginary component of the said voltage drop;

adjusting the said further voltage in such a way as to balance the said imaginary component of the said voltage drop.

Preferably, the phase of deriving a measurement current from the said conductor comprises associating a measurement transformer with the said conductor, able to generate the said measurement current in correlation with the said alternating current.

Preferably, the said predetermined relationship is dependent on the transformation ratio of the said transformer.

In a preferred form the phase of converting the said measurement current comprises passing the said measurement current through a resistor of predefined value.

In particular the said predetermined relationship is dependent on the predefined value of the said resistor.

In particular the said phase of withdrawing an adjustable portion of voltage comprises connecting a voltage divider in parallel with the said resistor.

In particular the said phase of comparing comprises supplying the said voltage drop and the said adjustable portion of voltage to a null indicator.

In a further aspect the present invention relates to a method for measuring the series resistance of a conductor traversed by an alternating current comprising the phases of:

measuring at least a real component of a voltage drop over a predetermined length of the said conductor;

deriving a measurement current from the said conductor, the said measurement current have a real component only and having a predetermined relationship with the said alternating current; characterized by converting the said measurement current into a corresponding measurement voltage having a predefined conversion ratio with the said measurement current;

withdrawing a portion of voltage from the said measurement voltage;

comparing the said portion of voltage with the said voltage drop;

measuring the difference between the said portion of voltage and the said voltage drop;

selecting the said portion of voltage at a known value such that the said difference is less than a predefined value;

measuring the said alternating current;

determining the resistance as a function of the value of the said known value of the said portion of voltage, of the said difference and of the value of the said alternating current.

In a further aspect the present invention relates to a system for measuring the series resistance of a conductor traversed by an alternating current comprising:

a voltage sensor applied over a predetermined length of the said conductor able to deliver a measured voltage having at least a real component;

a current sensor applied to the said conductor able to deliver a measurement current having a real component only, and having a predetermined relationship with the said alternating current;

a current/voltage converter having a predefined conversion ratio with the said measurement current, for converting the said measurement current into a corresponding voltage;

a voltage divider capable of delivering an adjustable division of the said corresponding voltage;

a null indicator receiving the said measured voltage and the said adjustable division, able to indicate the balancing between the real components of the said measured voltage and of the said adjustable division;

a voltage meter able to deliver the value of the said adjustable division and the value of the said corresponding voltage;

means of calculation able to determine the value of the resistance as a function of the value of the said adjustable division, of the value of the said corresponding voltage, of the said predetermined relationship and of the said predefined conversion ratio.

Preferably it further comprises a variable mutual inductance associated with the said conductor and able to deliver a variable voltage having an imaginary component only and a null indicator able to indicate the balancing between the imaginary component of the said measured voltage and the said variable voltage delivered by the said variable mutual inductance.

Preferably the said null indicator consists of a vector voltmeter.

More preferably the said null indicator consists of a lock-in amplifier.

In particular the said voltage meter is a meter having an accuracy of greater than 0.1%.

Preferably the said current/voltage converter comprises a resistor through which the said measurement current flows; said resistor has an inductance value of less than 1 $\mu$H.

In particular the said voltage divider comprises a variable potentiometer connected in parallel with the said resistor; the said potentiometer has an inductance value of less than 1 $\mu$H.

In particular the said resistor has an accuracy of greater than 0.1%.

Preferably the said current sensor comprises a transformer operatively connected to the said conductor.

BRIEF DESCRIPTION OF THE DRAWINGS

Further details may be gleaned from the following description, with reference to the appended drawings in which is shown.

DETAILED DESCRIPTION OF THE INVENTION

Figure 1:
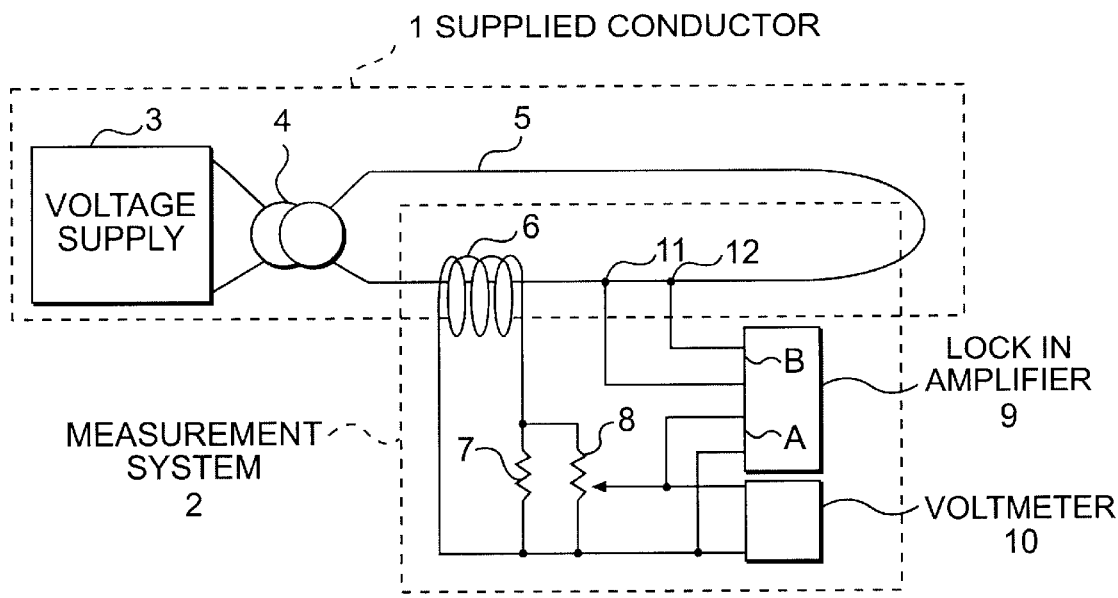
in FIG. 1 a diagram of the bench for measuring the alternating-current resistance according to a first embodiment of the present invention.

Represented diagrammatically in FIG. 1 is a bench for measuring alternating-current resistance according to the first embodiment of the present invention.

The measurement bench comprises a supplied conductor 1 and a measurement system 2.

The supplied conductor 1 comprises an alternating voltage supply 3 connected to the input of a transformer 4; the output of the transformer 4 supplies a conductor 5 whose alternating-current resistance it is desired to measure.

The measurement system 2 comprises a precision current transformer 6 having a predetermined relationship, equivalent to the transformation ratio, with the current of the conductor 5, and supplies a transformed current to a resistor 7. Connected in parallel with the resistor 7 is a variable potentiometer 8. An adjustable voltage is withdrawn from the potentiometer 8 and delivered to a precision voltmeter 10. By adjusting the potentiometer to one extreme thereof, the precision voltmeter 10 is capable also of measuring the voltage across the resistor 7.

The same adjustable voltage withdrawn by the potentiometer 8 is also delivered to an input A of a lock-in amplifier 9.

Two voltage sensors 11 and 12 are applied, with a predefined distance between them, to the conductor 5. The sensor 11 and the sensor 12 are connected to an input B of the lock-in amplifier 10.

Figure 2:
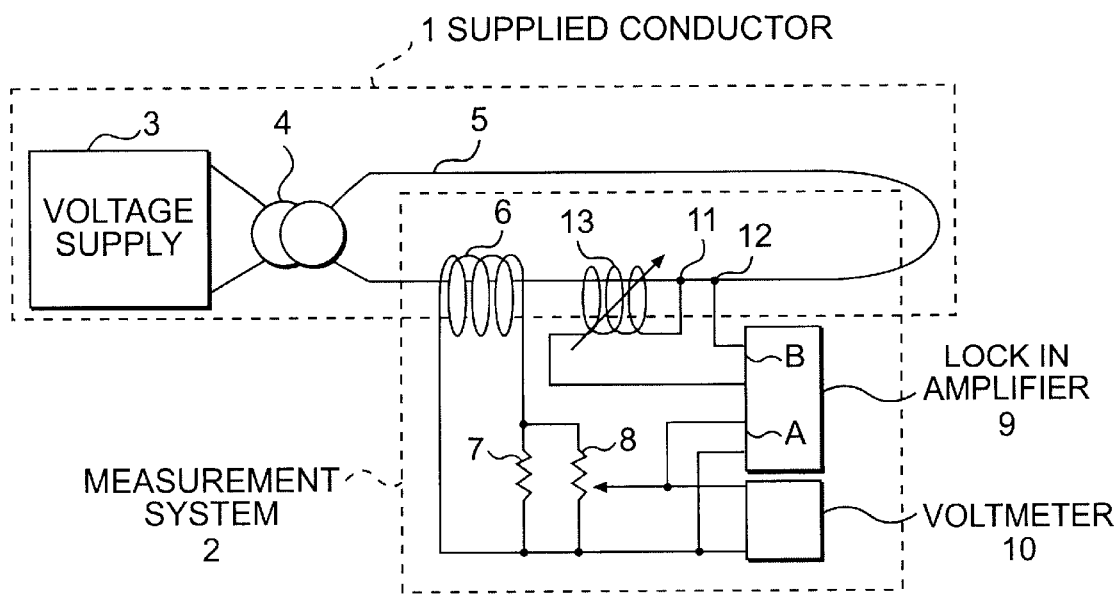
in FIG. 2 a diagram of the bench for measuring the alternating-current resistance according to a second embodiment of the present invention.

Represented diagrammatically in FIG. 2 is a bench for measuring alternating-current resistance according to a second embodiment of the present invention.

This embodiment differs from that of FIG. 1 by the presence of a variable mutual inductance 13. The sensor 11 is connected to one terminal of the inductance 13, and the other terminal of the inductance 13 and the sensor 12 are connected to the input B of the lock-in amplifier 10.

Referring to the first embodiment of FIG. 1 the principle of measuring the resistance is as follows.

Across the sample resistor 7 there will be a voltage Uta proportional to the current Is flowing in the conductor 5. The resistor 7 behaves like a current/voltage converter having a conversion ratio which is given by the value of this resistor. If the sample resistor 7 is a pure resistor, and if the transformer 6 has negligible angle error, the value of the voltage Uta will in practice have the real component only. This voltage Uta will depend on the transformation ratio n of the precision current transformer 6 and on the value R of the sample resistor 7, i.e. Uta=Is/n*R. This voltage Uta is applied to the potentiometer 8, from which it is possible to withdraw an adjustable division $\eta$Uta thereof, measured by the precision voltmeter 10 and applied to the input A of the lock-in amplifier 9. The lock-in amplifier 9 will be set to function "A" (function operative on the input A) and will therefore use the frequency of this voltage as a reference frequency for the measurement. That is to say it will perform the so-called "autophase" function for synchronizing its internal phase reference with this signal.

The voltage Urc+Uxc withdrawn by the sensors 11 and 12 is connected to the input B of the lock-in amplifier 9. This voltage will have a resistive component Urc and a reactive component Uxc.

Having set the lock-in amplifier 9 to the function "A-B" (function operative on the difference between the input A and the input B), we shall therefore operate on the variable potentiometer 8, delivering the voltage $\eta$Uta in such a way as to balance the resistive component Urc of the voltage present at the input B of the lock-in amplifier 9. The attaining of the balance condition will be displayed by the lock-in amplifier 9 as zeroing of the readout of the "real component" channel which displays the real component of the voltage.

On attaining the balance (cancelation) between the voltages $\eta$Uta and Urc, i.e. when the magnitude of the voltage ηUta is equal to the voltage Urc, the value of the voltage ηUta will be read using the voltmeter 10.

The voltage Uta, i.e. the voltage across the resistor 7, will be measured using the voltmeter 10 by for example taking the slider of the potentiometer to the upper extreme, and hence the value of the alternating-current resistance Rac of the conductor will be calculated to be Rac=ηUta R/(n Uta)=ηR/n, i.e. it will be given by the ratio between two measurements multiplied by R and divided by n.

In order to obtain a value for the resistance per unit length (Ω/m), the value Rac that has now been found will have to be divided by the predefined distance between the sensor 11 and the sensor 12.

Referring now to the second embodiment of FIG. 2 it will be necessary to operate, not only on the potentiometer 8, but also on the variable mutual inductance 13, which delivers a reactive voltage Uxl so as to balance the reactive component Uxc of the voltage present at the input B of the lock-in amplifier 9. The attaining of the balance condition will again be displayed by the lock-in amplifier 9 as zeroing of the readout of the "imaginary component" channel which displays the imaginary component of the voltage. The balancing of the reactive component of the voltage makes it possible to increase the sensitivity of the lock-in amplifier 9. By canceling the reactive component of the voltage, which is normally of smaller value than the active component, it is possible to improve the sensitivity of the instrument (reduce its full scale) and hence the performance of the measurement method.

An example of an embodiment of the bench for measuring alternating-current resistance according to a second embodiment of the present invention will now be described.

To obtain an accuracy such as that required for this measurement, i.e. better than 0.1%, the supply 3 should have for example the following characteristics: deliver a current of from 100 A to 3500 A, with an amplitude stability of greater than 0.05% over one hour, a frequency stability of greater than 0.01 Hz over one hour, and a distortion of less than 0.2%.

The supply 3 is in particular that provided by the company Audio Equipment, Rue Bechevelin 22, 69007 Lyon, France, consisting of a signal generator connected to a set of 6 amplifiers suitably connected so as to yield 5000 W. The output of the amplifiers is connected to the transformer 4.

The supply 3 can also consist of a voltage stabilizer whose input is connected to the electrical mains and whose output is connected to a for example 0–400 V, 150 A autotransformer, and then to the transformer 4 which supplies the conductor 5.

The current transformer 4 is from the firm BC Transformateurs, Allee des Justices, 85200 Fontenay Le Comte, France, with a voltage and current on the primary of 400 V and 150 A max., (60 KVA), and the capacity to yield up to 4000 A on the secondary (1500 V/40 A, 10 V/4000 A, 20 V/4000 A, 30 V/4000 A).

The conductor 5 consists of two cold-drawn electrolytic copper bars of circular cross section, 15 m long, with a diameter of 20 mm, used in one test, or of 40 mm used in a subsequent test. A conductor having this simple geometrical structure was used so as to be able to compare the measurements made with values calculated theoretically as described hereafter.

The presence of any magnetic or ferromagnetic materials lying close to the measurement bench can cause an increase in the measured value of the equivalent resistance, on account of losses through stray currents and/or through hysteresis due to the field generated by the high test current. In order to prevent this, the conductor 5 is placed on a frame, 1.5 m high, made of resin (glass fiber and polyester) of appropriate dimensions. The whole of the length of this frame is covered with a closure element, made of a dielectric material, 0.5 m high, open at its smaller ends, so as to offer the possibility of forced ventilation.

By way of precision current transformer 6 use has been made in particular of that sold by the company TETTEX, BernaStrasse 90 8953, Dietikon, Zurich, Switzerland, having a transformation ratio of 3500 A/5 A and an angle error Φ=0.5 min.

The sample resistor 7 has, in the example described here, the value 0.1Ω±0.01% of the already-mentioned company TETTEX, but different values may be used depending on the value of the value of the [sic] resistance Rac which is to be measured. Thus, from the above-stated relationships the following must hold: R>n Rac and R<(Rac n)/$\eta_{min}$, where $\eta_{min}$ corresponds to the smallest portion which can be discriminated by the potentiometer 8.

The accuracy of the sample resistor 7 should be equal to or preferably greater than the overall accuracy required (equal to or better than 0.1%) because the latter is used in measuring the current flowing in the conductor.

Preferably this resistor 7 should be a pure resistor, i.e. preferably with an inductance of less than 1 $\mu$H, because it serves to divert the voltage used to compensate for the real component of the voltage.

The variable potentiometer 8 has the value 10 kΩ of the multiturn cermet type. Preferably it should be a pure resistor, i.e. preferably with an inductance of less than 1 $\mu$H. The value of the potentiometer 8 is preferably less than the typical impedance of the lock-in amplifier 9 (around 100 MΩ), and greater than the resistor 7, so as to avoid influencing these elements of the measurement circuit.

The variable inductance 13 was constructed by the Applicant and is described below.

Figure 3:
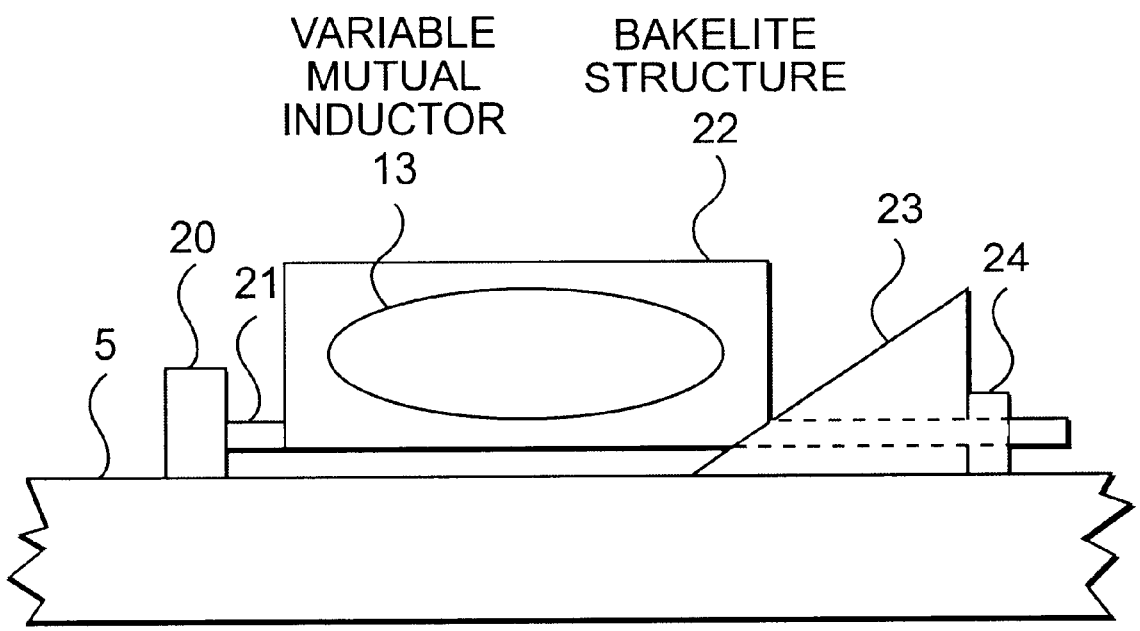

We now refer to FIG. 3, where the variable mutual inductance 13 is schematized. For simplicity of illustration, only the structure relating to one winding of the inductor 13 has been represented. Preferably the inductor 13 comprises 6 windings connected together in series and placed so as to be perpendicular to the flux induced by the conductor 5 in order to obtain maximum linkage. These windings are also placed symmetrically with respect to one another so as to eliminate any disturbances induced in them by the surrounding environment.

The structure of the variable mutual inductance 13 consists of a first tube of polyethylene with which the conductor 5 is clad; one end 20 of the first tube is fixed to the conductor 5.

This first tube has 6 slits for almost the whole of its length, starting from the end which is not fixed to the conductor 5.

The 6 windings are housed on 6 bakelite structures 22, radial with respect to the conductor 5 and connected to guides 21 forming part of the first tube.

The conductor 5 is clad in a second polyethylene tube 23 having a conical shape and placed in such a way that it can be moved in the direction of the first tube, and in particular towards the interior of the first tube, which will raise the structures 22, moving the windings away from the axis of the conductor 5. By moving the second tube 23 in the opposite direction, the windings will come closer to the conductor 5. In order to adjust the position between the first tube and the second tube 23 use is made of a block 24 placed on the guide 21.

By varying the relative positions of the first tube and the second tube 23 it is thus possible to vary the value of the inductor 13.

Each winding is formed by 20 coils with intermediate taps at for example 2 and 7 coils, so as to be able to withdraw voltage values which are more appropriate to the subsequent operations.

In particular this inductor 13 should be a pure inductor because it has to provide a voltage which is capable of compensating for the imaginary component of the voltage measured on the conductor 5.

The lock-in amplifier 9 is the model SR-830 sold by Stanford Research Systems, 1290-D Reamwood Ave., Sunnyvale, Calif. This amplifier has a measurement accuracy (or gain accuracy) equal to 1%; the reference channel has an absolute phase error of 1° and a relative phase error of less than 0.001°, an orthogonality of 90°±0.001°; the internal oscillator has an accuracy of 25 ppm+30 $\mu$Hz and a distortion equal to −80 dBc.

A different lock-in amplifier may also be used, such as for example the model 5210 sold by EG&G Instruments, Princeton Applied Research P.O. Box 2565, Princeton, N.J. 08543-2565, USA, and this amplifier also has a measurement accuracy (or gain accuracy) equal to 1%.

In particular the lock-in amplifier 9 should preferably exhibit an angle error between real channel and imaginary channel of less than 0.1°.

The lock-in amplifier 9 is a very sensitive voltmeter capable of carrying out vector analysis of a voltage signal, i.e. of separating it into a resistive or real component and a reactive or imaginary component, with respect to a reference signal onto which the instrument is "clamped".

Lock-in amplifiers are used to detect and measure very small alternating signals. Accurate measurements can be made even when the small signals are obscured by noise.

The lock-in amplifier uses a technique known as phase-sensitive detector to pick out the signal component at a specific frequency and phase and clamp onto it. Noise and signals present at frequencies other than the reference frequency are eliminated: so as not to influence the measurement.

In accordance with the invention it is possible to use other instruments which make it possible to achieve the results described above.

The precision voltmeter 10 used in the experiment is a model HP 3458A multimeter sold by Hewlett-Packard S.A. P.O. Box 529, 1180 AM Amstelveen, The Netherlands. This instrument exhibits an accuracy in the range from 100 mV−10V equal to 0.007% of the readout+0.002% of the range.

Other voltmeters, with accuracy equal to or better than that desired for measuring the resistance (0.1%), can be used.

Measurement of the real component of the voltage drop over the conductor could be carried out directly with the lock-in amplifier 9, but the nominal accuracy of this instrument is equal to 1%, whereas an accuracy of better than 0.1% is required. If the lock-in amplifier 9 is used as a null detector alone, it is used at its maximum precision, since its error is defined as a percentage, so the absolute error is minimal the smaller the signal to be measured. The balance voltage used to calculate the resistance is measured by the voltmeter 10 which has a greater accuracy than that of the lock-in amplifier 9.

Each of the voltage sensors 11 and 12 consists of an enameled copper wire 1 mm in diameter soldered to the conductor 5.

The distance between the sensors 11 and 12 should be such as to be able to detect a voltage which can be perceived by the instruments used, distances of 5 m and 10 m having been used in the tests.

Soldered to each voltage sensor 11 and 12 is an enameled wire, of the same type as above, used to make the connection between the sensors 11 and 12 with the measuring instruments.

Preferably the enameled wire connected to the sensor 12 is sited along the conductor 5 until it reaches the sensor 11. Preferably for around half of the distance between the sensor [sic] 11 and 12 the enameled wire is located above the conductor 5 and for the other half the enameled wire is located beneath the conductor 5, in such a way as to minimize the disturbances induced in the wire by any external magnetic fields. The two enameled wires joined up at the point where the sensor 11 is located are twisted together from here to the measuring instruments.

Theoretical calculations have also been performed in order to verify the results obtained with this method of measurement. These calculations were performed using theories described by the articles already cited and by the CEI 287 standard.

The following tables record the results of the measurements and calculations performed at the 50 Hz frequency.

The direct current resistance Rdc was calculated according to what is stated in the above-cited articles.

The ratio between the alternating-current resistance and the direct current resistance Rac/Rdc has also been calculated. The value of the direct current resistance Rdc depends mainly on the composition of the material of the conductor and so corresponds to the lowest resistance which may be anticipated of the conductor. The ratio Rac/Rdc is therefore representative of the resistive characteristics of the conductor.

The temperature of the conductor was measured using a series of thermocouples (for example 6) equispaced along the conductor. The value recorded is the mean value of the measurement of the thermocouples.

The following three tables record the results of the calculations and measurements performed for various diameters of the conductor, various distances between the sensors 11 and 12 and various distances between the cables.

TABLE 1

40 mm diameter conductor, distance between the two cables 1.5 m, distance between the sensors 11 and 12 equal to 5 m.

| N | Temp. (° C.) | Rac mea. (Ω/m) | Rdc calc. (Ω/m) | Rac/Rdc mea. | Rac calc. (Ω/m) | Rac/Rdc calc. | Rac/Rdc error % |
|---|---|---|---|---|---|---|---|
| 1 | 20 | 1.8096E-5 | 1.3567E-5 | 1.3338 | 1.8081E-5 | 1.3327 | 0.08 |
| 2 | 21.5 | 1.8129E-5 | 1.3665E-5 | 1.3267 | 1.8048E-5 | 1.3298 | 0.23 |
| 3 | 49.3 | 1.9472E-5 | 1.5129E-5 | 1.2671 | 1.9383E-5 | 1.2811 | 0.46 |

TABLE 2

40 mm diameter conductor, distance between the two cables 0.2 m, distance between the sensors 11 and 12 equal to 5 m.

| N | Temp. (° C.) | Rac mea. (Ω/m) | Rdc calc. (Ω/m) | Rac/Rdc mea. | Rac calc. (Ω/m) | Rac/Rdc calc. | Rac/Rdc error % |
|---|---|---|---|---|---|---|---|
| 1 | 86 | 2.1086E-5 | 1.7086E-5 | 1.2341 | 2.10789-5 | 1.2335 | 0.033 |
| 2 | 86 | 2.1084E-5 | 1.7086E-5 | 1.2340 | 2.10789-5 | 1.2335 | 0.024 |

TABLE 3

20 mm diameter conductor, distance between the two cables 1.5 m, distance between the sensors 11 and 12 equal to 10 m.

| N | Temp. (° C.) | Rac mea. (Ω/m) | Rdc calc. (Ω/m) | Rac/Rdc mea. | Rac calc. (Ω/m) | Rac/Rdc calc. | Rac/Rdc error % |
|---|---|---|---|---|---|---|---|
| 1 | 23.2 | 5.7459E-5 | 5.5298E-5 | 1.0391 | 5.7375E-5 | 1.0375 | 0.15 |
| 2 | 23.9 | 5.6339E-5 | 5.5448E-5 | 1.0161 | 5.6900E-5 | 1.0261 | 0.99 |
| 3 | 23.9 | 5.7100E-5 | 5.5448E-5 | 1.0291 | 5.6958E-5 | 1.0272 | 0.19 |

Good agreement between this method of measurement and the calculated values is noted from the tables.

It is believed that small uncertainties in the measurements are predominantly due to the poor accuracy in measuring the temperature. Thus, each variation of one degree Centigrade introduces an error of around 0.4% in the value of the resistance.

The accuracy of the measurement depends mainly on the accuracy of the measuring instrument, i.e. the voltmeter 10, and on the value of the resistor 7 which is used to calculate the current flowing in the conductor.

It is not important to know the precise value of the potentiometer 8 and of the inductor 13, the only requirement being that they should, as far as possible, be a pure resistance and a pure inductance.

What is claimed is:

1. Method for measuring the series resistance of a conductor traversed by an alternating current comprising the steps of:
   measuring at least a real component of a voltage drop over a predetermined length of the conductor;
   deriving a measurement current from the conductor, the measurement current having a real component only and having a predetermined relationship with the alternating current;
   converting the measurement current into a corresponding measurement voltage having a predefined conversion ratio with the measurement current;
   withdrawing an adjustable portion of voltage from the measurement voltage;
   comparing the adjustable portion of voltage with the voltage drop;
   adjusting the adjustable portion of voltage in such a way as to balance the voltage drop;
   measuring the adjustable portion of voltage which balances the voltage drop;
   deriving a value for the alternating current;
   determining the resistance as a function of the value of the adjustable portion of voltage which balances the voltage drop and of the value of the alternating current.

2. Method for measuring the series resistance in accordance with claim 1, wherein the step of deriving a value for the alternating current further comprises:
   measuring the measurement voltage;
   determining the value of the alternating current as a function of the measured measurement voltage, the predefined conversion ratio, and the predetermined relationship.

3. Method for measuring the series resistance in accordance with claim 1, further comprising eliminating the imaginary component of the voltage drop.

4. Method for measuring the series resistance in accordance with claim 3, wherein the step of eliminating the imaginary component of the voltage drop further comprises:
   measuring an imaginary component of the voltage drop;
   withdrawing a further adjustable voltage from the conductor, having an imaginary component only;
   comparing the further voltage with the imaginary component of the voltage drop;
   adjusting the further voltage in such a way as to balance the imaginary component of the voltage drop.

5. Method for measuring the series resistance in accordance with claim 1, wherein said step of deriving a measurement current from the conductor further comprises associating a measurement transformer with the conductor, which generates the measurement current in correlation with the alternating current.

6. Method for measuring the series resistance in accordance with claim 5, wherein the predetermined relationship is dependent on the transformation ratio of the transformer.

7. Method for measuring the series resistance in accordance with claim 1, wherein the step of converting the measurements current comprises passing the measurement current through a resistor of predefined value.

8. Method for measuring the series resistance in accordance with claim 7, wherein the predetermined relationship is dependent on the predefined value of the resistor.

9. Method for measuring the series resistance in accordance with claim 7, wherein the step of withdrawing an adjustable portion of voltage comprises connecting a voltage divider in parallel with the resistor.

10. Method for measuring the series resistance in accordance with claim 1, wherein the step of comparing comprises supplying the voltage drop and the adjustable portion of voltage to a null indicator.

11. Method for measuring the series resistance of a conductor traversed by an alternating current comprising the steps of:
- measuring at least a real component of a voltage drop over a predetermined length of the said conductor;
- deriving a measurement current from the conductor, the measurement current having a real component only and having a predetermined relationship with the
- converting the measurement current into a corresponding measurement voltage having a predefined conversion ratio with the measurement current;
- withdrawing a portion of voltage from the measurement voltage;
- comparing the portion of voltage with the voltage drop;
- measuring the difference between the portion of voltage and the voltage drop;
- selecting the portion of voltage at a known value such that the difference is less than a predefined value;
- measuring the alternating current;
- determining the resistance as a function of the value of the known value of the portion of voltage, of the difference, and of the value of the alternating current.

12. System for measuring the series resistance of a conductor traversed by an alternating current comprising:
- a current sensor connected to the conductor that delivers a measurement current having a real component only, and having a predetermined relationship, with the alternating current;
- a current/voltage converter connected to the current sensor and having a predefined conversion ratio with the measurement current for converting the measurement current into a corresponding voltage;
- a voltage divider connected to the converter that provides an adjustable division of the corresponding voltage;
- a voltage sensor applied over a predetermined length of the conductor that delivers a measured voltage having at least a real component;
- a null indicator receiving the measured voltage and the adjustable division, which indicates a balancing between the real components of the measured voltage and of the adjustable division;
- a voltage meter that delivers the value of the adjustable division and of the corresponding voltage.

13. System for measuring the series resistance in accordance with claim 12, further comprising a variable mutual inductance associated with the conductor and delivering a variable voltage having an imaginary component only and a null indicator that indicates the balancing between the imaginary component of the measured voltage and the variable voltage delivered by the variable mutual inductance.

14. System for measuring the series resistance in accordance with claim 12 or 13, wherein the null indicator consists of a vector voltmeter.

15. System for measuring the series resistance in accordance with claim 12 or 13, wherein the null indicator consists of a lock-in amplifier.

16. System for measuring the series resistance in accordance with claim 12, wherein the voltage meter is a meter having an accuracy of greater than 0.1%.

17. System for measuring the series resistance in accordance with claim 12, wherein the current/voltage converter comprises a resistor through which the measurement current flows.

18. System for measuring the series resistance in accordance with claim 17, wherein the voltage divider comprises a variable potentiometer connected in parallel with the resistor.

19. System for measuring the series resistance in accordance with claim 18, wherein the variable potentiometer has an inductance value of less than 1 $\mu$H.

20. System for measuring the series resistance in accordance with claim 17, wherein the resistor has an accuracy of greater than 0.1%.

21. System for measuring the series resistance in accordance with claim 17, wherein the resistor has an inductance value of less than 1 $\mu$H.

22. System for measuring the series resistance in accordance with claim 12, wherein said current sensor comprises a transformer operatively connected to said conductor.

* * * * *

UNITED STATES PATENT AND TRADEMARK OFFICE
CERTIFICATE OF CORRECTION

PATENT NO.   : 6,512,383 B1
DATED        : January 28, 2003
INVENTOR(S)  : Gömöry et al.

It is certified that error appears in the above-identified patent and that said Letters Patent is hereby corrected as shown below:

Column 12,
Line 53, "eliminating the" should read -- eliminating an --.

Column 13,
Line 10, "measurements" should read -- measurement --.
Line 30, after "with the", insert -- alternating current; --.

Signed and Sealed this

Fifteenth Day of July, 2003

JAMES E. ROGAN
*Director of the United States Patent and Trademark Office*